United States Patent [19]
Oppold et al.

[11] Patent Number: 6,002,633
[45] Date of Patent: Dec. 14, 1999

[54] PERFORMANCE OPTIMIZING COMPILER FOR BUILDING A COMPILED SRAM

[75] Inventors: Jeffery H. Oppold, Richmond; Michael R. Ouellette, Westford; Michael J. Sullivan, Essex Junction, all of Vt.

[73] Assignee: International Business Machines Corporation, Armonk, N.Y.

[21] Appl. No.: 09/225,075

[22] Filed: Jan. 4, 1999

[51] Int. Cl.[6] .............................. G11C 8/00; G11C 11/00
[52] U.S. Cl. .............................. 365/230.03; 365/230.06; 365/154; 365/156
[58] Field of Search .................................. 365/154, 156, 365/230.03, 230.06

[56] References Cited

U.S. PATENT DOCUMENTS

| | | | |
|---|---|---|---|
| 4,490,697 | 12/1984 | Yasuda et al. | 365/194 |
| 5,187,394 | 2/1993 | Hoshizaki et al . | |
| 5,471,428 | 11/1995 | Baroni et al. | 365/201 |
| 5,566,127 | 10/1996 | Hoshizaki | 365/233 |
| 5,652,732 | 7/1997 | Shah | 365/233 |
| 5,659,513 | 8/1997 | Hirose et al. | 365/205 |
| 5,703,821 | 12/1997 | Baroni et al. | 365/204 |
| 5,737,270 | 4/1998 | Oppold et al. | 365/230.06 |
| 5,754,468 | 5/1998 | Hobson | 365/154 |

OTHER PUBLICATIONS

"Configurable Multi–Port SRAM", *IBM Technical Disclosure Bulletin*, vol. 32, No. 10B, Mar. 1990, pp. 197–199.
"CMOS High Performance Sense Scheme For Growable Macros",*IBM Technical Disclosure Bulletin*, vol. 31, No. 6, Nov. 1988, pp.128–129.

*Primary Examiner*—Trong Phan
*Attorney, Agent, or Firm*—Pollock, Vande Sande & Amernick

[57] ABSTRACT

A compiler for building at least one compilable SRAM including at least one compilable sub-block. A global control clock generation circuit generates a global control signal. At least one local control logic and speed control circuit controls the at least one compilable sub-block. The local control logic and speed control circuit is controlled by the global control signal. An algorithm receives an input capacity and configuration for the sub-block of the SRAM array. An algorithm determines a number of wordlines and bitlines required to create the sub-block of the input capacity. An algorithm optimizes a cycle time of the sub-block by determining global control clock circuits based upon the number of wordlines and bitlines in the sub-block. An algorithm optimizes access time of the sub-block by determining local speed control circuits based upon the number of wordlines and bitlines.

39 Claims, 9 Drawing Sheets

PERFORMANCE OPTIMIZING COMPILER FOR BUILDING A COMPILED SRAM

FIELD OF THE INVENTION

The present invention relates to a static random access memory (SRAM) arrays. In particular, the present invention relates to a method and compiler for creating at least one sub-array of the SRAM.

BACKGROUND OF THE INVENTION

An SRAM compiler is a computer program which can synthesize different memory configurations. Variables which determine a specific memory configuration are word width, number of words, and number of memory blocks. An SRAM compiler program creates a netlist of the memory, simulates the worst case delay path through the memory to generate timing information, builds a symbol of the SRAM for placement in a schematic, builds a simulation model with the timing information, creates a physical layout of the SRAM, builds a routing abstraction of the SRAM, and creates a power grid structure for the SRAM. In general, an SRAM compiler is used to generate memories for application specific integrated circuits (ASICs) such as a gate array or a standard cell circuit. A compiled SRAM may be one of many components which make up an integrated circuit.

An SRAM generated by a compiler contrasts greatly with an SRAM designed for the general marketplace as a stand alone part. Typically, general product SRAMs are full custom designs which focus on memory density, speed, power, yield, and package size. All of these constraints must be met within a short design cycle time to introduce a successful SRAM in a highly competitive market.

Creating an SRAM compiler is a task which involves both design and computer resources. Memory sizes and word widths on an ASIC can vary drastically depending on the customer application. Initial efforts attempted to take existing full custom memory designs and build them into memory compilers. Writing the computer code to create a configurable memory from a full custom design proved to be an extremely difficult task. Most abandoned this approach and created new memory designs which simplified writing the code to synthesize various memory configurations and reduce the complexity of building the physical layout of the SRAM.

Two features are typical of most SRAM compiler designs. First, the compiler builds a single block of memory for the application. Second, decoding stages are designed to minimize layout changes which reduces the complexity of the physical layout compiler. For large memory sizes both of these standard compiler attributes reduce SRAM performance. Larger memory array sizes increase loadings on outputs of decoder circuits and memory cells, increasing SRAM access times. Building the decoding circuits to simplify layout changes often compromises performance for high row/column counts.

In general, large amounts of memory are required in complex integrated circuit designs. The memory required typically takes the form of a large single SRAM or multiple smaller SRAMs.

The main limitation in an SRAM generated by a computer (compiled SRAM) is performance. The memory size typically is dictated by the largest SRAM that can be formed that meets the system speed requirements of an integrated circuit. Presently, compilers have been unable to generate SRAMs approaching the speed/density of the full custom SRAM designs.

In the past, techniques for defining subsets of a memory have included compiling a circuit macro by using a set of predetermined circuit blocks. According to such techniques, as illustrated in FIG. 1, in the physical layout of an SRAM, a central block structure may be formed that includes control circuits, word/bit decoder circuits, and a required number of wordline selector circuits. Storage block macros may be formed that include an array of memory cells grown to the required size in the wordline direction, bit selectors, write drivers, sense amplifier circuits, and output latches. The final SRAM may be formed by placing in the bitline direction, the required number of storage block macros, around the central block structure. Multiple bit selector circuits may permit some performance versus area optimization by varying the aspect ratio of the number of wordlines versus the number of bitlines. This technique provides minimal performance optimization, and does not include a technique for optimizing performance over a range of SRAM sizes.

The above-described technique may be enhanced for compiling SRAMs with multiple read and write ports. According to the enhanced technique, a silicon compiler approach may be utilized to generate the various layouts for the required subcircuits. The compiler calculates load capacitance and increases buffer transistor sizes, based on technology information, to maintain a pro-programmed signal rise/fall time. Once all buffer sizes are known, the compiler then generates the transistor layout and wiring.

While the idea of addressing a subset of a memory array may be known, the techniques do not optimizing performance over an entire range of subset sizes. Additionally, known techniques do not disclose how to control critical timing of the SRAM and, thus, the actual technique for determining performance versus the size of the SRAM.

One technique for timing control employs what are commonly called "dummy wordline" and "dummy bitline" control signals. These control signals attempt to mimic the time required to generate enough signal on the bitline so that the sense amplifier operates correctly, as well as to assure the SRAM cycles at a functional rate.

According to this technique, an extra wordline decoder circuit may be selected every cycle to drive a "dummy wordline" net. The "dummy wordline" is constructed of "dummy cells", such that the signal net delay is proportionally equal to the net delay of a selected wordline. The "dummy wordline" net in turn drives the gate of a "dummy device", which discharges a "dummy bitline" net.

The "dummy bitline" is constructed of "dummy cells" similar to the "dummy wordline", such that it is also proportionally equal to the load of a real bitline. This discharging "dummy bitline" net, which is used as a mimic of the signal generation delay, is then used to control the sense amplifier set clock. In a compilable SRAM, such as that illustrated in FIG. 2, the "dummy wordline" and "dummy bitline" nets grow as the SRAM is grown. Thus, in theory, their net delays increase versus the size of the RAM.

In a design where a "dummy wordline" and a "dummy bitline" are 100% physically matched to the "real wordline" and "real bitline" structures, the slope of their delays, as a function of array size, will be parallel, as illustrated in FIG. 3. This approach has the advantage of the sense amplifier set signal delay tracking the bitline signal delay versus size, temperature, process, and voltage. However, a large performance penalty is taken because a dual sense scheme is required to sense both the dummy bitline, which in turn initiates the sense of real data.

An improved approach, is to scale the dummy structures such that they are faster than the real wordline & bitline delays. In this case, as illustrated in FIG. 4, the "dummy" delays are set so that the maximum size RAM has the minimum required signal margin, which eliminates the delay penalty. However, this structure no longer has a delay slope parallel to the real wordline/bitline delays. Thus, a large performance penalty results with smaller RAMs. Also, since the physical structures are no longer matched, the delay tracking versus process, temperature, and supply voltage is greatly degraded.

This design technique has proven to be somewhat effective in compilable SRAMs up to now. It will track process, voltage, and temperature such that signal margin can be guaranteed, while maintaining functionality across the full operational range. However, each variation of this approach results in some overall loss of RAM performance.

SUMMARY OF THE INVENTION

To provide a solution to the above-discussed and other problems, aspects of the present invention provide a compiler for building at least one compilable SRAM including at least one compilable sub-block. The compiler includes a global control clock generation circuit for generating a global control signal. At least one local control logic and speed control circuit controls the at least one compilable sub-block. The local control logic and speed control circuit is controlled by the global control signal. The compiler also includes an algorithm for receiving an input capacity and configuration for the sub-block of the SRAM array. An algorithm determines a number of wordlines and bitlines required to create the sub-block of the input capacity. An algorithm optimizes a cycle time of the sub-block by determining global control clock circuits based upon the number of wordlines and bitlines in the sub-block. An algorithm optimizes access time of the sub-block by determining local speed control circuits based upon the number of wordlines and bitlines.

The present invention also provides a method for building at least one compilable SRAM including at least one compilable sub-block. A global control is provided to the at least one sub-block such that it operates as an independent locally controlled SRAM.

Furthermore, the present invention provides a memory device that includes a plurality of memory cells, a plurality of wordlines, a plurality of bitlines, and a compiler for building at least one compilable SRAM including at least one compilable sub-block. The compiler includes a global control clock generation circuit for generating a global control signal. At least one local control logic and speed control circuit controls the at least one compilable sub block. The local control logic and speed control circuit is controlled by the global control signal. The compiler also includes an algorithm for receiving an input capacity and configuration for the sub-block of the SRAM array. An algorithm determines a number of wordlines and bitlines required to create the sub-block of the input capacity. An algorithm optimizes a cycle time of the sub-block by determining global control clock circuits based upon the number of wordlines and bitlines in the sub-block. An algorithm optimizes access time of the sub-block by determining local speed control circuits based upon the number of wordlines and bitlines.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

The present invention provides a new method for compiling Static RAMs such that the electrical performance, including cycle time, access time, setup time, among other properties, is optimized for all physical sizes of the compiled Static RAM. As compared to known techniques, such as those described above, the present invention, as described in detail below may achieve a performance improvement of about 30%,.

To accomplish this, among other things, the present invention solves the problem of clock optimization, including restore and data sense enable, versus the SRAM size. As a result, the present invention enables performance optimization across the entire compilable range. Also, this invention insures that the timing relationships between global clocks track across process, voltage, temperature, and the size of the SRAM itself.

To provide for optimized performance at all potential requested SRAM sizes, the present invention provides a compiler for building at least one compilable SRAM including at least one compilable sub-block. The present invention also includes a method for building at least one compilable SRAM including at least one compilable sub block. The present invention also includes a memory device.

According to the present invention, a single global control signal is generated. The pulse characteristics of the global control signal are optimized by the compiler such that for any given number of wordlines it will correctly control numerous small memory sub-blocks via local control logic circuits. Each local control logic circuit includes its own speed control elements. The speed control elements have also been optimized by the compiler for maximum performance.

The present invention may utilize a matched physical structure on the global control signal's transmission line such that the physical structure is identical to the physical structure of the cell's wordline control signal transmission line. As a result, the present invention may provide matched delays between the global control signal and the wordline control signal versus the number of bitlines, as well as delay tracking versus process, voltage, and temperature.

Figure 1:
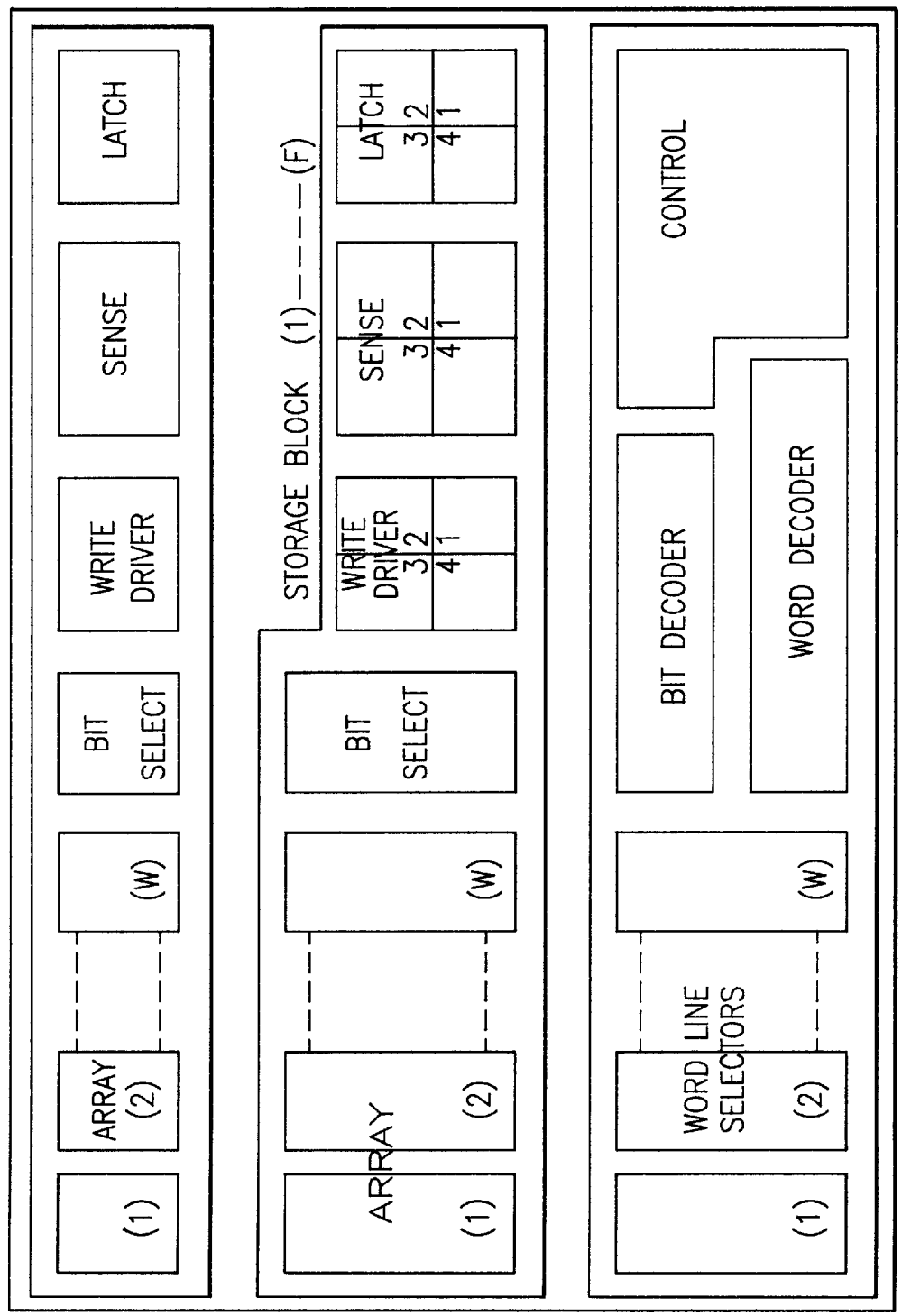
FIG. 1 represents an example of a known growable SRAM architecture.
Figure 2:
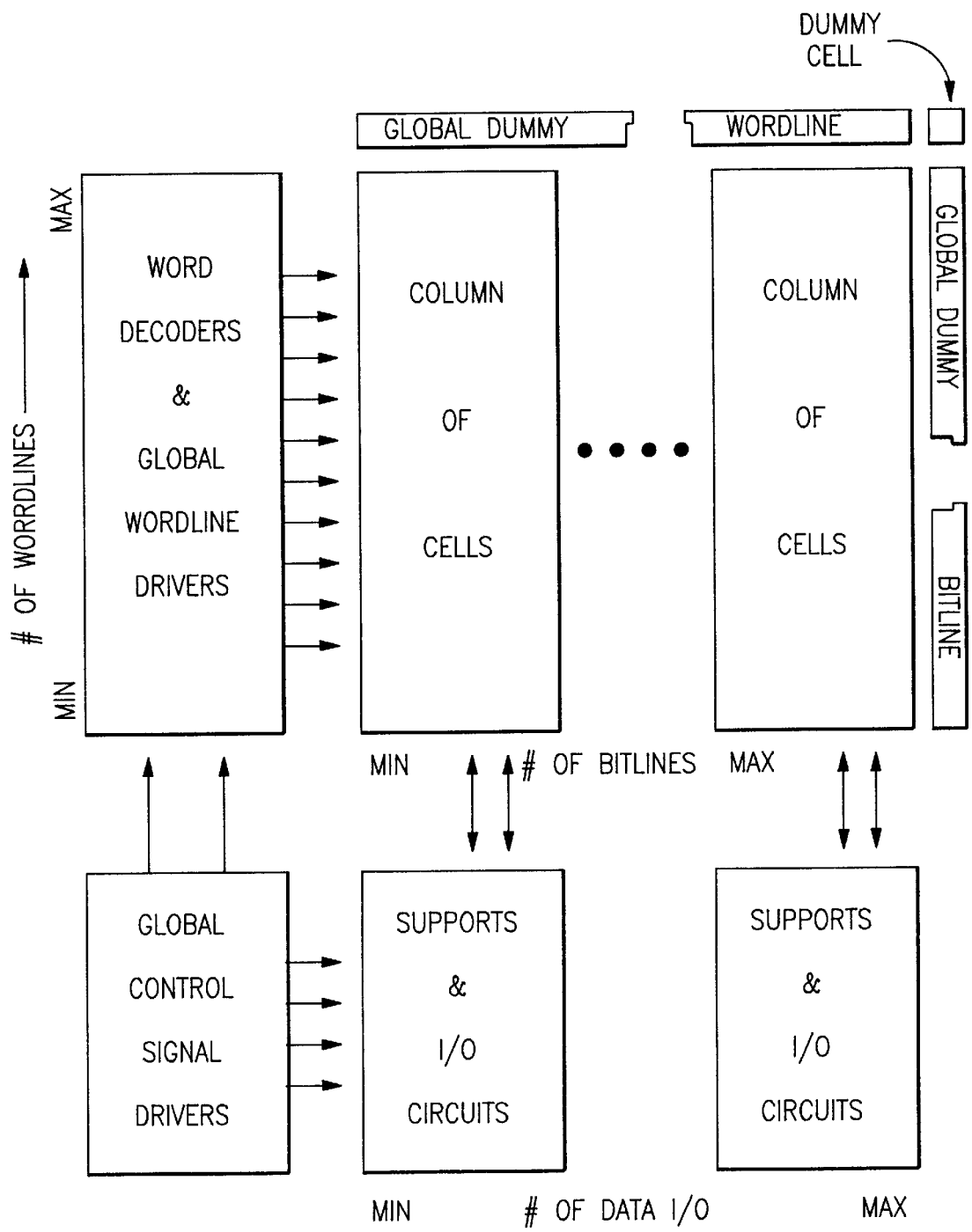
FIG. 2 represents another example of a known growable SRAM architecture.
Figure 3:
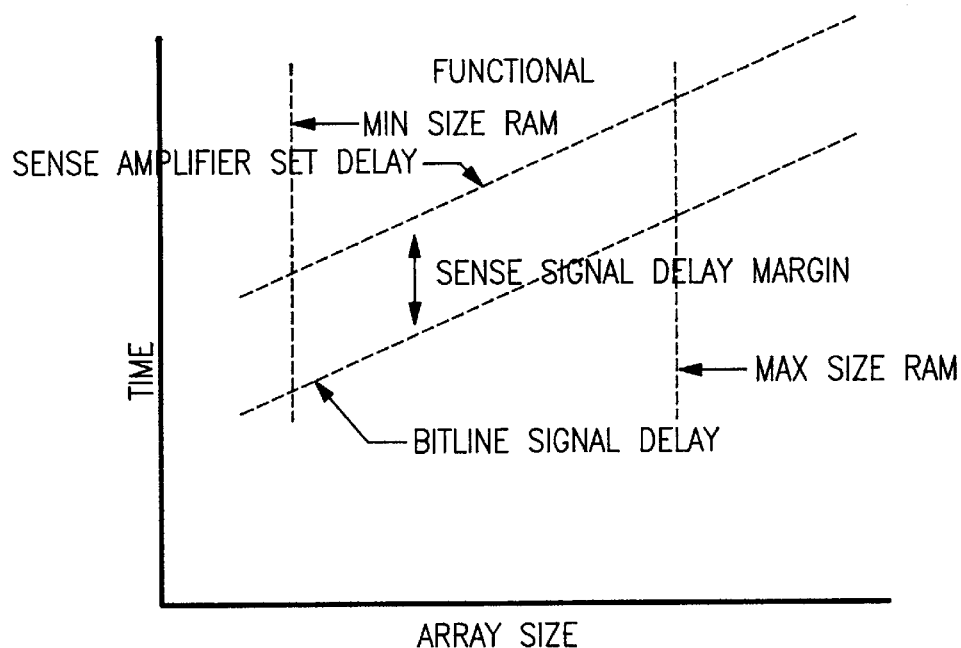
FIG. 3 represents a graph that illustrates a relationship between time and array size for matched dummy wordline/bitline delays in a known growable SRAM architecture.
Figure 4:
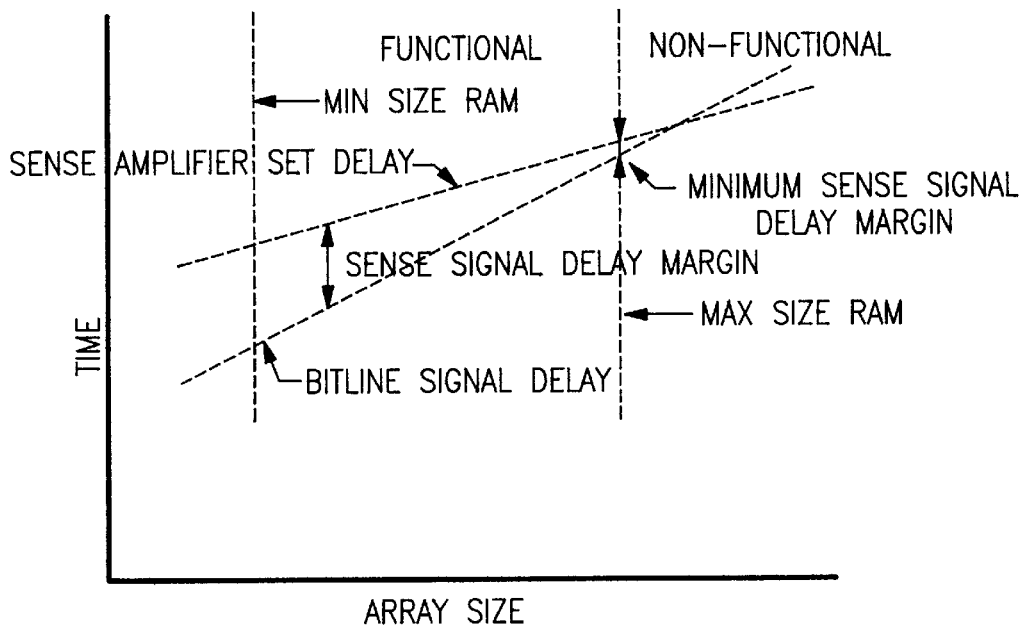
FIG. 4 represents a graph that illustrates a relationship between time and array size for unmatched dummy wordline/bitline delays in a known growable SRAM architecture.
Figure 5:
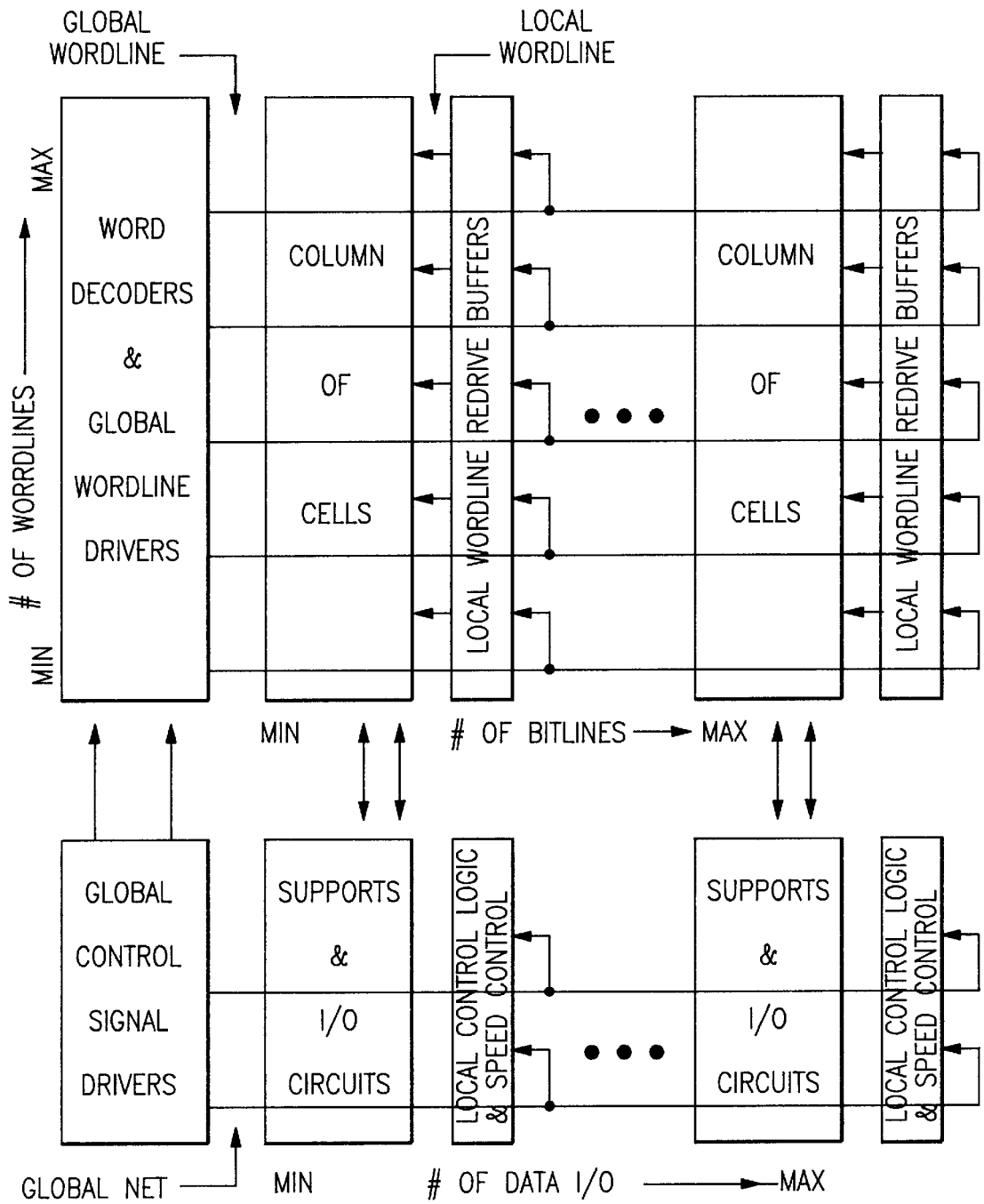
FIG. 5 represents an embodiment of a growable sub-block SRAM architecture according to the present invention illustrating sub-block layout arrangement.

FIG. 5 illustrates one example of an embodiment of a Sub-Block SRAM architecture that includes Local Control Logic. FIG. 5 also illustrates the sub-block layout arrangement. As can be seen in FIG. 5, a growable sub-block SRAM architecture according to the present invention includes a plurality of columns of memory cells. FIG. 5 only illustrates two sub-blocks, with the intervening sub-blocks not shown. Word decoders and global drivers are associated with the memory cells.

The memory cells have associated supports and input/output circuits. Local control logic and speed control are associated with each support and input/output circuit through a local net. On the other hand, the supports and input/output circuits are interconnected with the global signal drivers through a global net. The local control logic and speed control generates signals having a fixed pulse width but with a variable delay.

A plurality of local wordline redrive buffers are associated with each column of memory cells. Wordlines extend among the columns of memory cells. The number of wordlines increases with increasing sizes of the sub-blocks of the SRAM.

A global wordline is associated with all of the columns of memory cells. Global control clock drivers are interconnected with the word decoders and global wordline drivers. The global control clock drivers generate variable pulse width and variable delay.

In the context of the present invention, the concept of Sub-Blocks is defined as a means of breaking up the required large array of cells into much smaller arrays, and then providing local control to each of the small arrays such that they behave like smaller independent SARMs. Each local control unit is controlled by a common Global Control signal.

Figure 6:
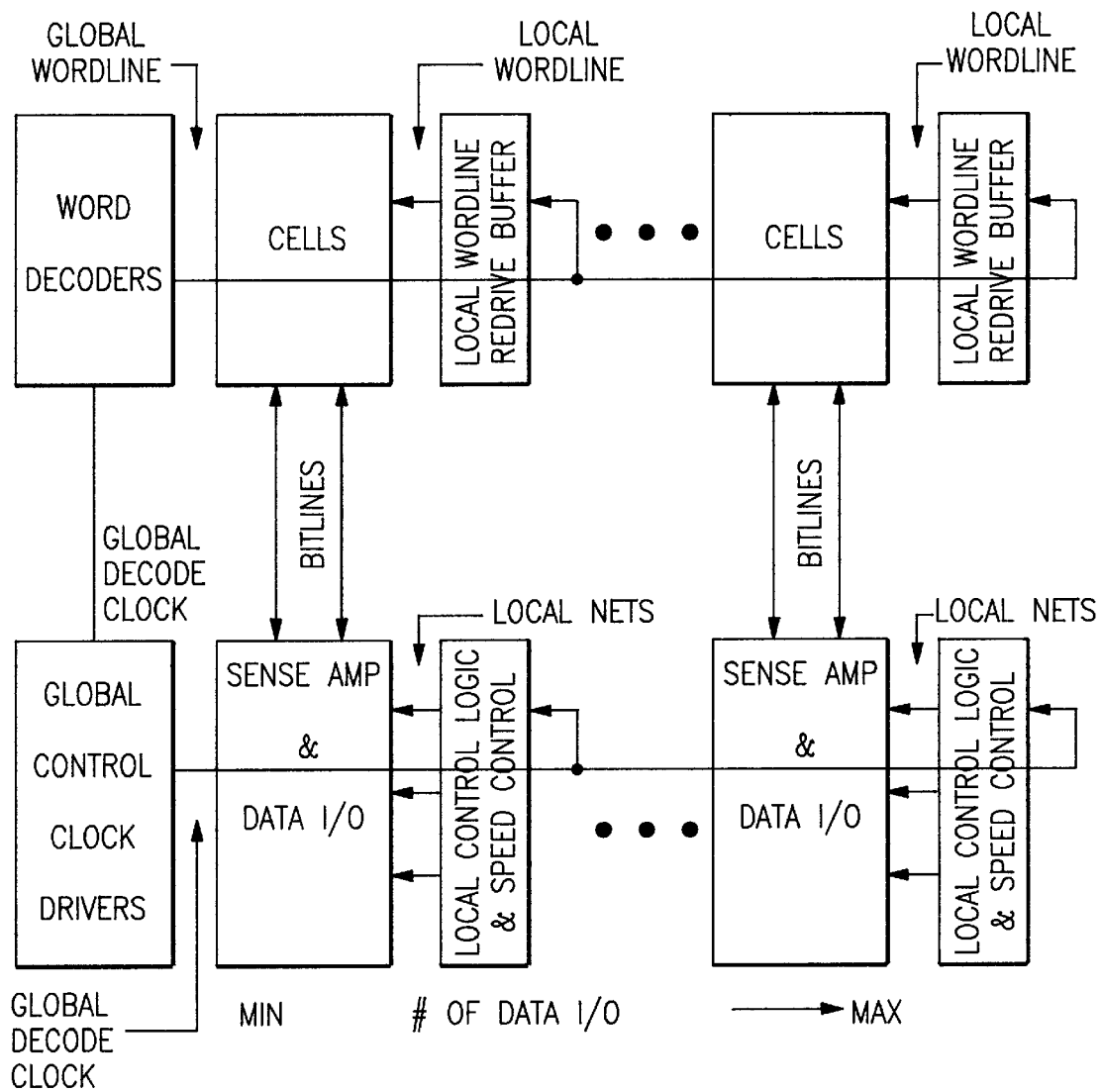
FIG. 6 represents a detailed view of a portion of the embodiment of a growable sub-block SRAM architecture shown in FIG. 5.

FIG. 6 illustrates a more detailed view of the embodiment of the growable sub-block architecture represented in FIG. 5. As such, FIG. 6 illustrates bitlines that interconnect the memory cells with the sense amplifier that forms part of the supports and data input/output circuits. FIG. 6 also indicates the flow of control signals from the global control clock drivers to the word decoders as a global decode clock signal. As seen in FIG. 6, the global wordline transmits signals to the local wordline redrive buffer, which, in turn, transmits signals to the local wordlines interconnected among the cells. FIG. 6 also illustrates the interconnection between the global control clock drivers and the local control logic and speed control for transmission of a global control clock signal. Through local networks, the local control logic and speed control transmit local clock control signals to the sense amplifiers and data input/output interconnected with the memory cells.

Figure 7:
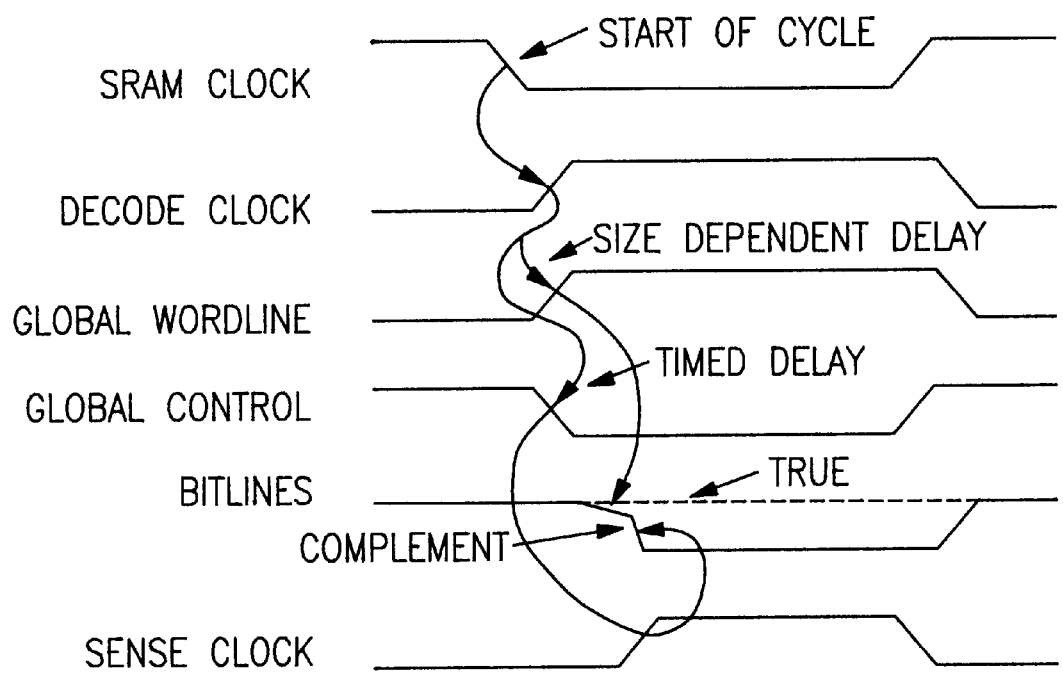
FIG. 7 represents an overview of critical timing of an embodiment of a growable sub-block SRAM architecture according to the present invention.

While FIGS. 5 and 6 illustrate elements of the memory device and interconnections among the elements, FIG. 7 illustrates flow of signals involved in the critical timing control of the overall SRAM array and the sub-blocks. As shown in FIG. 7, the cycle commences in the SRAM clock, which generates a timing signal. The SRAM clock transmits the timing signal to the decode clock. The decode clock transmits the clock signal to the global wordline. In response, a global wordline signal is generated and is transmitted to a local wordline redrive buffer, generating a local wordline signal, which is received by the SRAM cell, causing it to generate true/complement differential voltage on the bitlines of the memory array. In parallel to the generation of the global wordline signal, the decode clock generates a size-dependent delay, and transmits it to the global control clock driver. Upon receiving the timed delay signal, the global control clock driver transmits a global control signal to the various local control logic and speed control circuits. After receiving the signal from the global control clock driver, the local control logic and speed control circuit generates a size-dependent delayed sense clock signal. The sense clock signal is transmitted to and received by the sense amplifier, at which time significant true/complement differential voltage on the bitlines is present for proper data sensing.

Figure 11:
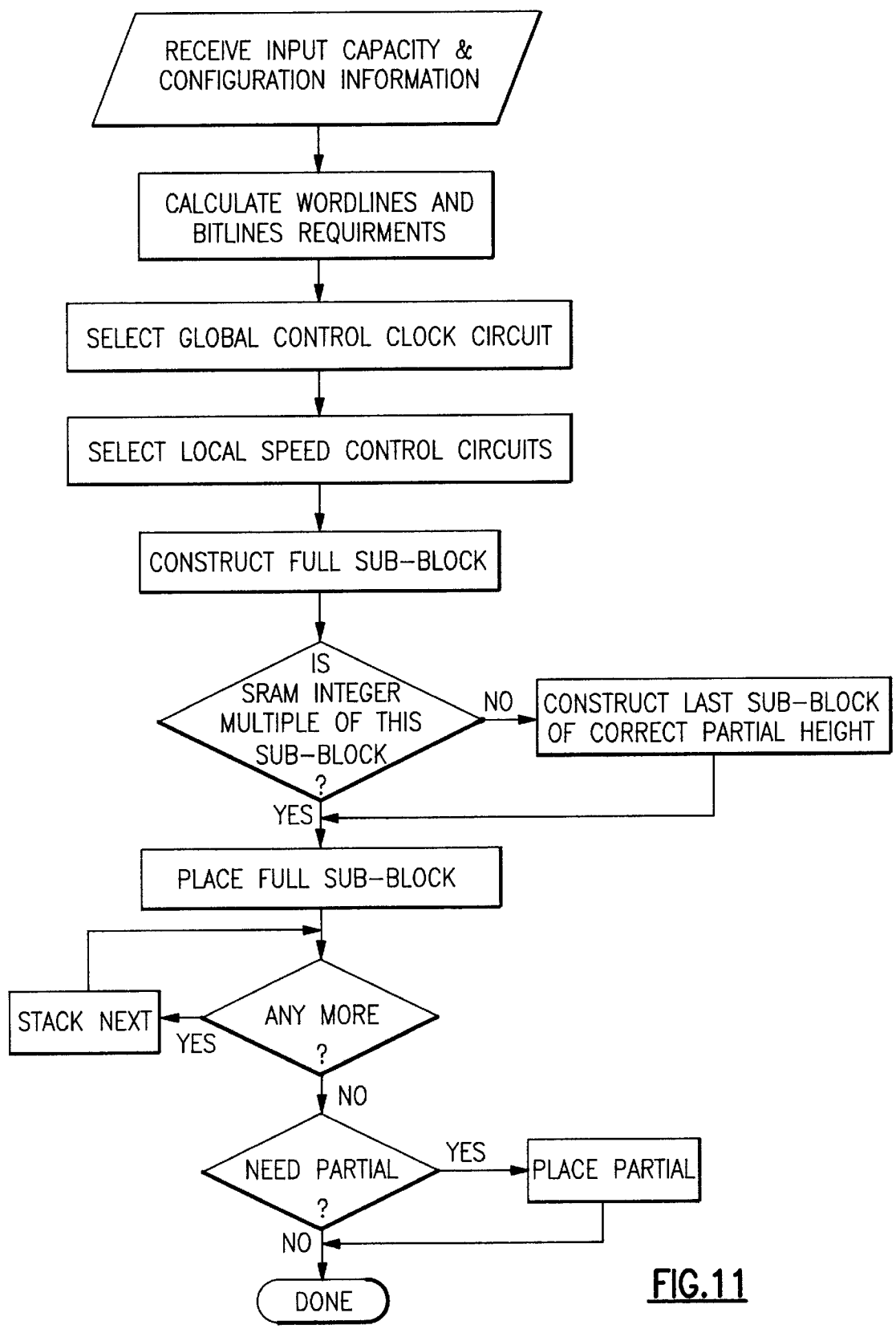
FIG. 11 represents a flow-description of the SRAM compiler algorithm.

The algorithm used by the compiler to construct the SRAM is illustrated in the flow-description of FIG. 11.

The desired size of the SRAM array is input or otherwise provided to the compiler. To construct a full large array, the compiler first assembles the required sub-block, based on the number of wordlines and the number of bitlines per sub-block, and attaches a local control unit to it. Sub-blocks are then stacked on top of each other, based on the total number of bitlines. The compiling algorithm automatically compensates for large SRAMs that are not an integer multiple unit of sub-blocks, by constructing the last sub-block to the correct height.

This technique of construction of reusable sub-blocks is used throughout the compiler code, fostering high performance operation. The compiler may be used to generate both the circuit macro representation (schematic/EDTF) (Electronic Design Interchange Format), as well as the physical representation (layout/GDSII) (Graphics Design System)

Using this base architecture and the compiler techniques described above, the present invention may include any one or more of the following circuit techniques. FIG. 6 illustrates the concept of multiple speed control circuits. The first speed control circuit, used to establish the SRAMs cycle time, and thus its active and restore time, is contained in the "Global Control Clock Driver" block. This circuit establishes the relationship between the Global Wordline signal and the Global Control Clock signal, as further illustrated in FIG. 7. In addition, this circuit also sets the pulse width of the global wordline signal and global control clock signal, thereby establishing the cycle time of the SRAM.

At the start of the cycle, the main SRAM Clock signal generates the Decode Clock signal, which in turn generates the Global Wordline Clock signal. Since the delay time to generate the Global Wordline Clock signal is dependent on the number of wordlines, or length of the bitline, a variable delay circuit typically is utilized to generate the proper delay between the Global Wordline signal and the Global Control Clock signal, such that a known relationship between these two major signals is maintained over the entire range of allowable SRAM sizes.

The second speed control circuit may be included in the "Local Control Logic & Speed Control" block shown in FIG. 6. Given that the proper delay relationship for the Global Wordline signal and the Global control clock signal has been established, and the two signals are bused on matching transmission lines as discussed below, the delay relationship between these two signals will remain constant at any point along the global signal lines. Therefore, the last remaining critical timing that needs to be established is the generation of the Sense Clock signal at a time when the bitlines differential voltage has developed sufficiently to assure proper operation of the sense amplifier.

Referring to FIG. 7, once again, the rise of the Global Wordline will initiate the generation of a differential voltage on the bitlines. Since the rate of this differential voltage generation is dependent on the length of the bitlines, which is a function of the number of wordlines, once again a variable delay circuit is required to generate the Sense Clock signal from the Global Control Clock signal.

It is these two variable delay circuits, the "Global Control Clocks" and the "Local Control Logic and Speed Control" that are adjusted by the SRAM Compiler based on the number of wordlines requested, thus providing optimized performance versus the number of wordlines. To optimize the SRAM's performance versus the number of bitlines, the present invention employs the concept of matched growable transmission lines. Each Global Control Signal may be driven through a Growable Global Net by a global driver feeding the inputs of each Local Control Logic stage, where it is re-driven to the Local Nets. As the need for more array cells increase, the compiler will add and/or generate sub-blocks, which in turn increases the length of the global nets.

Figure 8:
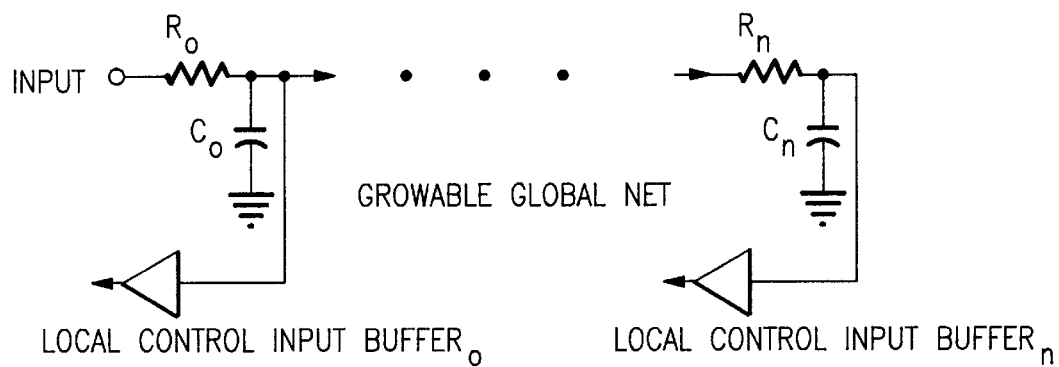
FIG. 8 represents a schematic diagram of resistance/capacitance components of a growable global transmission line of an embodiment of an SRAM architecture according to the present invention.

FIG. 8 illustrates two factors that affect the delay characteristics of the Growable Global Net transmission line. First, the resistance (R) and capacitance (C) of the metal line can affect the delay. Additionally, the input load, or FET device input capacitance, of the Local Control Input Buffer can affect the delay. To match metal line resistances, the lines should be identical or very similar in length and width, traverse in the same direction, and should be on the same process level.

In 0.5 micron or denser technologies, metal line capacitance typically is dominated by the line-to-line and fringe components. In turn, the line-to-line and fringe components are functions of metal-to-metal space and, to some extent, the underlaying topology. Therefore, to match the transmission line capacitance, the spacing to adjacent lines typically is fixed and equal.

Figure 9:
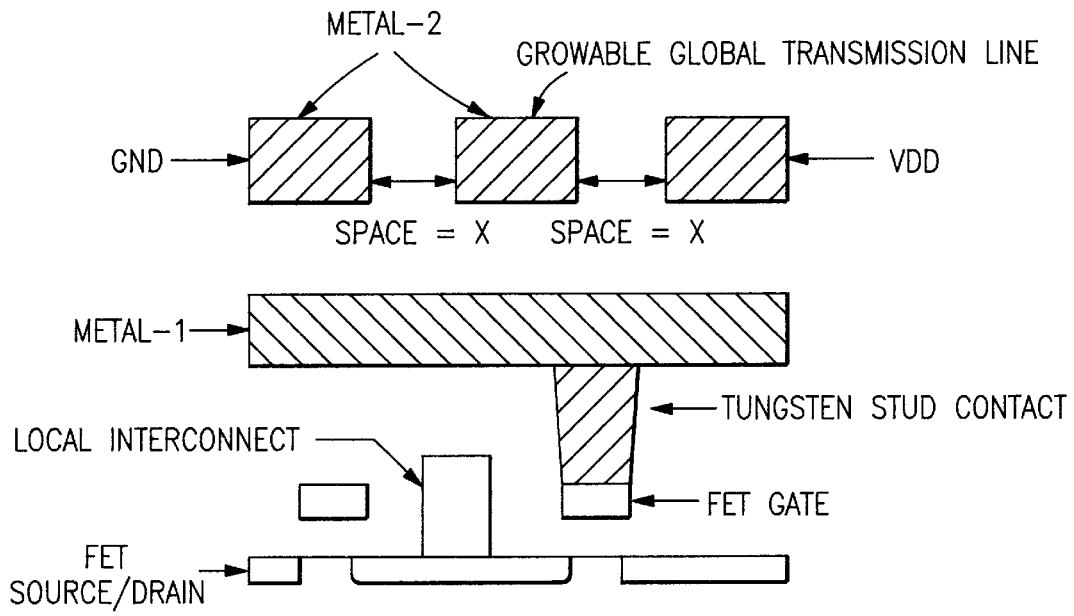
FIG. 9 represents a cross-sectional view of the structure of an embodiment of a portion of a global transmission line for an SRAM according to the present invention.

FIG. 9 illustrates one example of a structure according to the present invention where the Growable Global Transmission Line metal wires are surrounded by power and/or ground busses, thus providing fixed line spacing, wherein the space is x, with quiet non-switching nets. Using a metal level which is above the first level of metal will minimize the effects of underlying topology by isolating the transmission lines from the irregular FET Gates and local interconnect layout structures.

Figure 10:
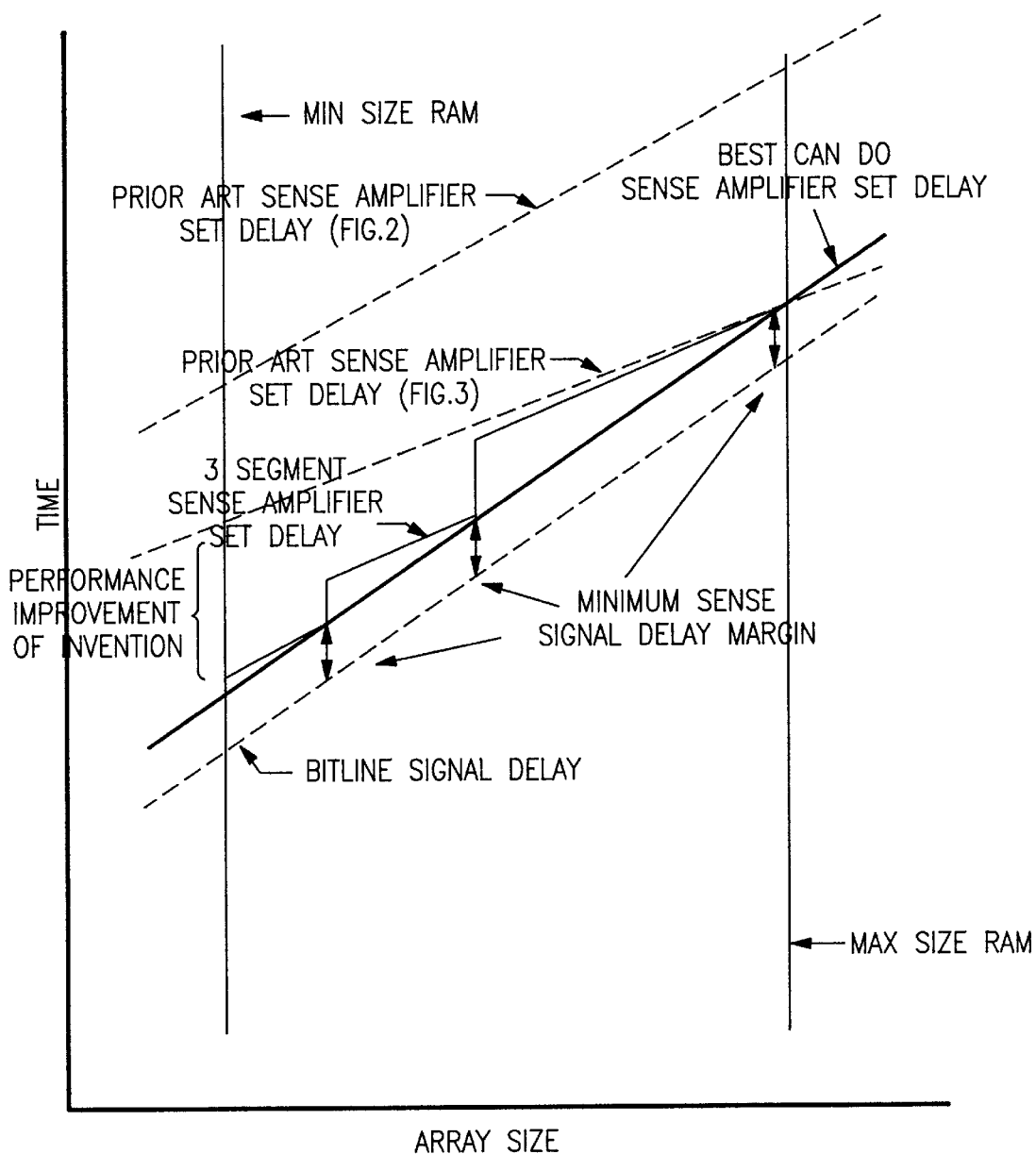
FIG. 10 represents a graph that illustrates a relationship between time and array size for an embodiment of a growable sub-block SRAM according to the present invention.

FIG. 10 represents a graph that illustrates the effects of the above invention techniques on the SRAM's performance versus the size of the array. The "Bitline Signal Delay" is constant for both examples of prior art techniques, as well as the technique according to the present invention. The bold solid line near the bottom, labeled as the "Best Can Do Sense Amplifier Set Delay", is the theoretical fastest time at which the sense amplifier can be clocked versus the size of the SRAM. This also represents the target line that this invention attempts to achieve. Ideally, the SRAM design would have a "Sense Amplifier Set Delay" that tracks the "Bitline Signal Delay", while maintaining a constant minimun "Sense Signal Delay Margin". In practice, the SRAM design typically is such that the SRAM is divided into manageable blocks, with the resulting "Sense Amplifier Set Delay" slope looking like a stair case. FIG. 10 illustrates one example of a "Sense Amplifier Set Delay" slope from an SRAM divided into 3 segments.

In a computer design system that utilizes a method for compiling Static Random Access Memories (SRAMs) FIG. 11, an additional method to be incorporated into the generation of the circuit macro can include calculating internal parameters, such as the number of wordlines and bitlines, from the requested number of words and bits. Also, the method can include optimizing SRAM cycle time by selecting proper speed control circuits, based on the number of wordlines and bitlines, for use in the Global Control Clock generation circuit. Additionally, SRAM access time may be optimized by selecting proper speed control circuits for use in the Local Control Logic generation circuits. Selection of the proper speed control circuits may be based on the number of wordlines and bitlines.

In a computer design system that utilizes a method for compiling Static Random Access Memories (SRAMs) FIG. 11, an additional method to be incorporated into the generation of the physical design can include insertion of correct circuit blocks corresponding to the calculated optimized circuit macro configuration, determined from the above, into an overall array of circuit blocks forming the final physical data of the RAM. Physical shapes may be sequentially generated such that the Global Control Clock signals and all Global Wordline Signals maintain matched transmission line structures for all RAM physical sizes.

The foregoing description of the invention illustrates and describes the present invention. Additionally, the disclosure shows and describes only the preferred embodiments of the invention, but as aforementioned, it is to be understood that the invention is capable of use in various other combinations, modifications and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A compiler for building at least one compilable SRAM including at least one compilable sub-block, the compiler comprising:

a global control clock generation circuit for generating a global control signal;

at least one local control logic and speed control circuit for controlling the at least one compilable sub-block, the local control logic and speed control circuit being controlled by the global control signal;

an algorithm for receiving an input capacity and configuration for the sub-block of the SRAM array;

an algorithm for determining a number of wordlines and bitlines required to create the sub-block of the input capacity;

an algorithm for optimizing a cycle time of the sub-block by determining global control clock circuits based upon the number of wordlines and bitlines in the sub-block; and an algorithm for optimizing access time of the sub-block by determining local speed control circuits based upon the number of wordlines and bitlines.

2. The compiler according to claim 1, wherein the cycle time optimizing circuit and the access time optimizing circuit select one of a plurality of global timing kernels for providing a different set of timing pulses compatible with the input capacity and configuration.

3. The compiler according to claim 2, wherein the cycle time optimizing circuit and the access time optimizing circuit select one of a plurality of local timing kernels for receiving one of a plurality of the global timing kernels and for providing a delay associated with one of the timing pulses, the delay being compatible with the input capacity.

4. The compiler according to claim 1, wherein the global control clock generation circuit and local control logic and speed control circuit provide control to at least one sub-block such that it operates as an independent locally controlled SRAM.

5. The compiler according to claim 1, wherein the global control clock generation circuit generates one global control signal having characteristics optimized by the compiler such that for a number of wordlines the global control signal will control a plurality of sub-block through the local control logic and speed control circuit.

6. The compiler according to claim 1, wherein the compiler optimizes the speed control elements of the local control logic and speed control circuit for maximum performance.

7. The compiler according to claim 1, further comprising:
a global control clock generation signal transmission line, wherein the SRAM includes a wordline control signal transmission line, and wherein the global control clock generation signal transmission line and the wordline control signal transmission line have a matched physical structure, thereby providing matched delays between the global control signal and a wordline control signal versus the number of bitlines included in the SRAM array.

8. The compiler according to claim 7, wherein the matched physical structure of the global control clock generation signal transmission line and the wordline control signal transmission line provide matched delay tracking versus process, voltage, and temperature.

9. The compiler according to claim 1, wherein the compiler breaks up the SRAM in to a plurality of sub-blocks, the local control logic and speed control circuit providing local control to each sub-block such that the sub-blocks function as independent locally controlled SRAMs, wherein the local control logic and speed control circuit is controlled by the global control signal.

10. The compiler according to claim 9, wherein the compiler assembles the required sub-block based upon the required number of wordlines and bitlines, stacks the sub-blocks on top of each other based upon the number of bitlines.

11. The compiler according to claim 10, wherein the compiler compensates for SRAM arrays having a size such that they cannot accommodate a whole number multiple unit of sub-blocks by constructing the last sub-block to a maximum possible height.

12. The compiler according to claim 1, further comprising:
at least one global control clock driver;
a plurality of speed control circuits, including a first speed control circuit included in the at least one global control clock driver for establishing a cycle time of the SRAM array, and establishing a relationship between a global wordline signal and the global control clock signal.

13. The compiler according to claim 1, further comprising:
a main SRAM clock for generating a decode clock which then generates a global wordline clock; and
a variable delay circuit for generating a delay between the global wordline clock and the global control clock such that a known relationship between the global wordline clock and the global control clock is maintained over a range of SRAM sizes.

14. The compiler according to claim 12, further comprising:
a second speed control circuit in the local control logic and speed control circuit.

15. The compiler according to claim 1, wherein compiler adjusts the global control clock and the local control logic and speed control circuit based upon the required number of wordlines.

16. The compiler according to claim 1, wherein the SRAM array includes matched growable transmission lines, the global control signal being driven through a growable global net by a global driver.

17. The compiler according to claim 1, wherein as the size of the sub-block increases, the compiler generates sub-blocks, which increases the length of global nets.

18. A method for building at least one compilable SRAM including at least one compilable sub-block, the method comprising the steps of:
defining at least one compilable sub-block inclded in at least one compilable SRAM; and
providing global control and local control to the at least one sub-block such that it operates as a locally controlled SRAM.

19. The method according to claim 18, further comprising the step of:
generating at least one global control signal for controlling the at least one sub-block.

20. The method according to claim 18, wherein defining the sub-block includes inputting a capacity and configuration of the sub-block, determining a number of wordlines and bitlines required to create the sub-block.

21. The method according to claim 18, further comprising the step of:
optimizing a cycle time of the sub-block by determining speed control circuits based upon the number of wordlines and bitlines in the sub-block.

22. The method according to claim 18, further comprising the step of:
optimizing access time of the sub block by determining speed control circuits based upon the number of wordlines and bitlines.

23. The method according to claim 18, wherein the local control of the sub-block is carried out with a local control logic circuit.

24. The method according to claim 19, further comprising the step of:

providing a matched delay between the global control signal and a wordline control signal of the SRAM array versus the number of bitlines of the SRAM array.

25. The method according to claim 19, further comprising the step of:

providing a matched delay between delay tracking of the global control signal and a wordline control signal of the SRAM array versus process, voltage, and temperature.

26. The method according to claim 19, wherein the SRAM array is broken up in to a plurality of sub-blocks and wherein the sub-blocks are locally controlled such that they operate as independent SRAMs, the global control signal controlling all of the sub-blocks.

27. The method according to claim 20, wherein the at least one sub-block is assembled based upon the number of wordlines and number of bitlines per sub-block and the method further comprises the step of:

attaching a local control circuit to the sub-block.

28. The method according to claim 20, wherein a plurality of sub-blocks are defined and further comprising the step of:

stacking sub-blocks on top of each other based upon the total number of bitlines.

29. The method according to claim 18, where in a plurality of sub-blocks are define d and further comprising the step of:

compensating for SRAM arrays having a size such that they cannot accommodate a whole number multiple unit of sub-blocks by constructing a last sub-block to a maximum possible height.

30. The method according to claim 18, further comprising the step of:

providing multiple speed control circuits including a first speed control circuit for establishing a cycle time of the SRAM sub-blocks including an active time and restore time of the sub-blocks.

31. The method according to claim 19, further comprising the steps of:

generating a global wordline signal; and establishing a relation ship between the global wordline signal and the global control signal.

32. The method according to claim 19, further comprising the stop of:

generating a decode clock which in turn generates a global wordline clock signal, wherein a time delay to generate the global wordline clock signal is dependent upon the number of wordlines.

33. The method according to claim 32, further comprising the step of:

generating a delay between the global wordline clock signal and the global control signal with a variable delay circuit such that a constant relationship between the global wordline clock signal and the global control signal is maintained over a range of sub-block sizes.

34. The method according to claim 30, further comprising the steps of:

carrying out local control of the sub-block with a local control logic circuit; and providing a second speed control circuit in the local control logic circuit and speed control block.

35. The method according to claim 19, further comprising the step of:

generating a sense clock from the global control signal with a variable delay circuit.

36. The method according to claim 19, further comprising the step of:

initiating generation of a differential voltage on the bitlines through the rise of a global wordline signal.

37. The method according to claim 19, further comprising the step of:

sequentially generating physical shapes such that the global control signal and global wordline signals maintain matched transmission line structures for all sub-block sizes.

38. A memory device, comprising:

a plurality of memory cells;

a plurality of wordlines;

a plurality of bitlines; and a compiler for building at leas tone compilable SRAM including at leas tone compilable sub-block, the compiler including a global control clock generation circuit for generating a global control signal;

at least one local control logic and speed control circuit for controlling the at leas tone compilable sub-block, the local control logic and speed control circuit being controlled by the global control signal;

an algorithm for receiving an input capacity and configuration for the sub-block of the SRAM array;

an algorithm for determining a number of wordlines and bitlines required to create the sub-block of the input capacity;

an algorithm for optimizing a cycle time of the sub-block by determining global control clock circuits based upon the number of wordlines and bitlines in the sub-block; and an algorithm for optimizing access time of the sub-block by determining local speed control circuits based upon the number of wordlines and bitlines.

39. An article of manufacture, comprising a computer usable medium having computer readable program code embodied therein for building at least one compilable SRAM including at leas tone compilable sub-block, the computer readable program code in the article of manufacture comprising:

computer readable program code for causing a computer to define at least one compilable sub-block included in at least one compilable SRAM; and computer readable program code for causing a computer to provide global control and local control to the at least one sub-block such that it operates as a locally controlled SRAM.

* * * * *